(12) United States Patent
Georgakos et al.

(10) Patent No.: US 7,795,669 B2
(45) Date of Patent: Sep. 14, 2010

(54) CONTACT STRUCTURE FOR FINFET DEVICE

(75) Inventors: Georg Georgakos, Erding (DE); Bernhard Dobler, Erding (DE)

(73) Assignee: Infineon Technologies AG, Neubiberg (DE)

( * ) Notice: Subject to any disclaimer, the term of this patent is extended or adjusted under 35 U.S.C. 154(b) by 479 days.

(21) Appl. No.: 11/755,507

(22) Filed: May 30, 2007

(65) Prior Publication Data

US 2008/0296681 A1 Dec. 4, 2008

(51) Int. Cl.
*H01L 29/94* (2006.01)
(52) U.S. Cl. ............... 257/327; 257/347; 257/E29.264; 257/E21.264
(58) Field of Classification Search .................. 257/327, 257/347, E29.264, E21.264; 438/283
See application file for complete search history.

(56) References Cited

U.S. PATENT DOCUMENTS 7,187,046 B2 * 3/2007 Wu et al. ..................... 257/412
7,276,763 B2 * 10/2007 Yeo et al. ..................... 257/328
2004/0048424 A1 3/2004 Wu et al.
2006/0063317 A1 3/2006 Donze et al.
2007/0045736 A1 3/2007 Yagishita

OTHER PUBLICATIONS

"German Office Action in 10 2008 025 708.7 dated Jan. 22, 2010", 6 pgs.

* cited by examiner

*Primary Examiner*—Zandra Smith
*Assistant Examiner*—Paul E Patton
(74) *Attorney, Agent, or Firm*—Schwegman Lundberg & Woessner, P.A.

(57) ABSTRACT

In accordance with an embodiment, a FinFET device includes: one or more fins, a dummy fin, a gate line, a gate contact landing pad, and a gate contact element. Each of the fins extends in a first direction above a substrate. The dummy fin extends in parallel with the fins in the first direction above the substrate. The gate line extends in a second direction above the substrate, and partially wraps around the fins. The gate contact landing pad is positioned adjacent to or above the dummy fin and electrically coupled to the gate line. The gate contact element is electrically coupled to the gate contact landing pad and is positioned to the top surface thereof.

10 Claims, 4 Drawing Sheets

US 7,795,669 B2

CONTACT STRUCTURE FOR FINFET DEVICE

TECHNICAL FIELD

The various embodiments of the application described herein relate generally to semiconductor devices, and, more particularly, to FinFET devices.

BACKGROUND

In recent years, with the advent of Fin Field Effect Transistors (FinFETs), the integrated circuits using FinFETs have smaller sizes, faster switching speed and higher current density than integrated circuits using traditional Metal Oxide Semiconductor Field Effect Transistors (MOSFETs). With the rapid development of high technology industry, there is an increasing demand of further size-reduced integrated circuits using FinFETs and more cost efficient methods of manufacturing the integrated circuits using FinFETs.

BRIEF DESCRIPTION OF THE DRAWINGS

Some embodiments are illustrated by way of examples, and not by way of limitations, in the figures of the accompanying drawings in which.

DETAILED DESCRIPTION

The following detailed description refers to the accompanying drawings that show, by way of illustration, specific details and embodiments in which the application may be practiced. These embodiments are described in sufficient detail to enable those skilled in the art to practice the application. Other embodiments may be utilized and structural, logical, and electrical changes may be made without departing from the scope of the application. The various embodiments are not necessarily mutually exclusive, as some embodiments can be combined with one or more other embodiments to form new embodiments.

The terms "a" or "an" in the following description may be used, as is common in patent documents, to include one or more than one. The term "or" the following description may be used to refer to nonexclusive or, such that "A or B" includes "A but not B," "B but not A," and "A and B," unless otherwise indicated.

The terms "wafer" and "substrate" in the following description may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "FinFET" in the following description denotes a fin field effect transistor. A FinFET may be built on a substrate or on a SOI substrate where a gate partially wraps around the fin. The fin functions as a channel for the FinFET. FinFET devices may have significantly faster switching speed and higher current density than traditional MOSFET devices. The term "FinFET" is used interchangeably with "multiple gate field effect transistor" (MuGFET).

The term "dummy fin" in the following description denotes an inactive fin, for example, a fin that has no electrical connectivity to other devices, circuits, or reference potential sources. There is no electric current passing through a dummy fin, even with a potential applied thereon, therefore a dummy fin does not function as a channel in a FinFET device.

Figure 1:
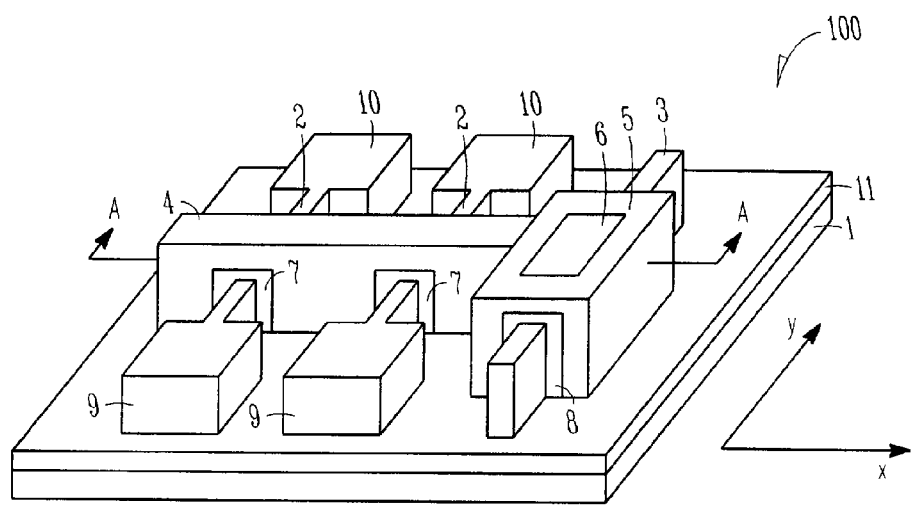
FIG. 1 is a perspective view of a FinFET device with a dummy fin in accordance with an example embodiment of the application.

FIG. 1 is a perspective view of a FinFET device 100 with a dummy fin in accordance with an example embodiment. The FinFET device 100 includes: one or more fins 2 (two fins 2 are shown in FIG. 1), a dummy fin 3, a gate line 4, a gate contact landing pad 5, and a gate contact element 6. Each of the fins 2 extends in a first direction (Y direction, as shown in FIG. 1) supported by a substrate 1, and is positioned between a source region 9 and a drain region 10. The dummy fin 3 extends in parallel with the fins 2 in the first direction above the substrate 1. Although only one dummy fin 3 is illustrated in FIG. 1, it can be understood that more than one dummy fins can be used. The gate line 4 extends in a second direction (X direction, at an angle that may be up to generally perpendicular to direction, as shown in FIG. 1) above the substrate 1, and partially wraps around the fins 2. The gate contact landing pad 5 is electrically coupled to the gate line 4, and is positioned proximate to, such as generally adjacent to or above the dummy fin 3 (also referring to FIG. 3), and supports the gate contact element 6 on the top surface thereof (also referring to FIG. 2). The gate contact element 6 is electrically coupled to the gate contact landing pad 5, and may be centered or otherwise positioned on top of the gate contact landing pad 5.

Although only a contact structure applied to the gate line 4 is illustrated in FIG. 1, the contact structure illustrated in FIG. 1 can also be applied to other conductive lines, for example, source lines, drain lines, and word lines (not shown in FIG. 1). Although only one conductive line (a gate line 4) is illustrated in FIG. 1, more than one conductive line (e.g., gate lines, source lines, drain lines, and word lines) can be formed above the substrate 1 and having a contact structure generally shown in FIG. 1.

Figure 3A:
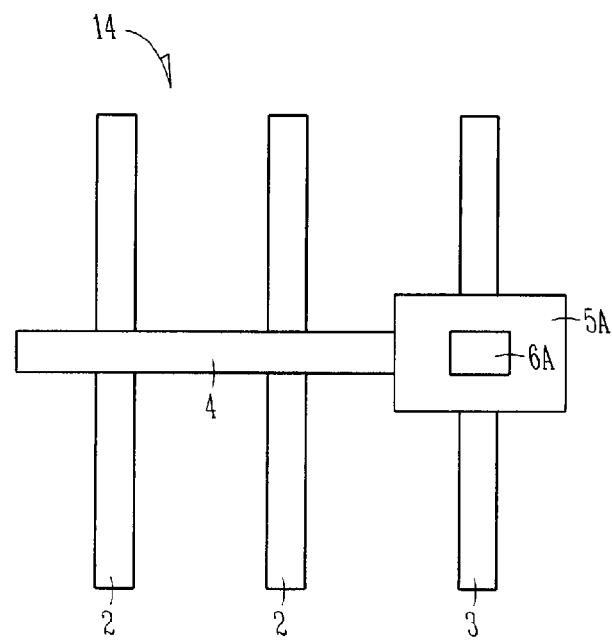
FIG. 3A is a planar top view of a FinFET device in accordance with example embodiments.
Figure 3B:
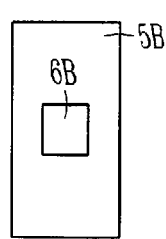
FIGS. 3B, 3C, and 3D are planar top views of alternative gate contact landing pads in detail according to example embodiments.

In some embodiments, referring to FIG. 3A, a layer of insulator 14 is formed to fill the space between the substrate 1 (not shown in FIG. 3A), the fins 2, the dummy fin 3, the gate line 4, the gate contact landing pad 5A, the source regions 9, and the drain regions 10. In one embodiment, the layer of insulator 14 is made of borophosphosilicate glass (BPSG). In some embodiments, the height of the formed layer of insulator 14 is at least as high as the highest one of the gate line 4 and the gate contact landing pad 5A.

Figure 2:
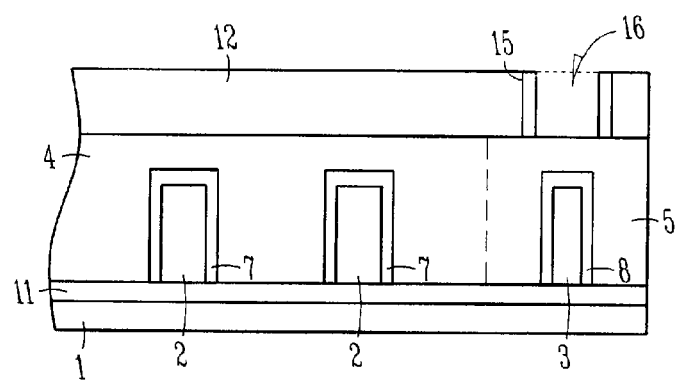
FIG. 2 is a modified cross-section view of the FinFET device as shown in FIG. 1 along section lines A-A in accordance with an example embodiment.

FIG. 2 is a modified cross-section view of the FinFET device in accordance with the embodiment of the application shown in FIG. 1 along section lines A-A.

In some embodiments, a layer of insulator 12 is formed, overlying the top surface of the layer of insulator 14, the gate line 4, and the gate contact landing pad 5. In one embodiment, the layer of insulator 12 is made of silicon dioxide ($SiO_2$).

In some embodiments, the gate contact element 6 is a via or opening 16 filled with conductive material. The opening 16 can be formed by selectively etching down through the layer of insulator 12 to the top surface of the gate contact landing pad 5, and then filling the opening 16 with a conductive material. Thus, the gate contact element 6 is electrically coupled to the gate contact landing pad 5. Optionally, before filling the opening 16 with the conductive material, a thin film of TiN may be applied to the opening 16 as a liner 15. In an embodiment, the conductive material is tungsten. Other suitable metals or conductive materials may also be used to fill in the opening 16. In another embodiment, the conductive material filled in the opening 16 may be made of one or more metals selected from the group of metals consisting of tungsten, copper, silver, gold, and aluminum. Since the gate contact landing pad 5 is electrically coupled to the gate line 4, the gate contact element 6 is electrically coupled to the gate line 4 and can be used to electrically couple the gate line 4 to other parts of the device, other devices, circuits, and potential reference sources.

FIG. 3A is a planar top view of a FinFET device in accordance with some embodiments of the application, which shows an arrangement of the fins 2, the dummy fin 3, the gate line 4, the gate contact landing pad 5, and the gate contact element 6.

As shown in FIG. 3A, the gate line 4 overlies the fins 2, and the gate contact landing pad 5A overlies the dummy fin 3. The gate contact landing pad 5A may be of different sizes and shapes. In some embodiments, the gate contact landing pad 5A has a cross-section taken along its height, which is substantially in the shape of a rectangle. In other embodiments, the cross-section of the gate contact landing pad 5A is substantially in the shape of a rectangle with rounded corners. In some embodiments illustrated in FIG. 3B, a gate contact landing pad 5B, in a different shape from the gate contact landing pad 5A shown in FIG. 3A, also partially wraps around the dummy fin 3. In a further example embodiment, the gate contact landing pad 5A or 5B may be an enlarged part of the gate line 4. The gate contact element 6A or 6B is coupled to the gate contact landing pad 5A or 5B, and is formed within the boundary of the top surface of the gate contact landing pad 5A or 5B.

Figure 3C:
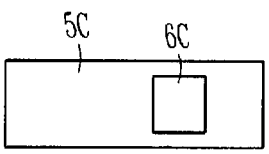
Figure 3D:
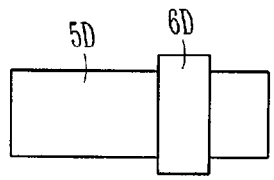

In other embodiments illustrated in FIGS. 3C and 3D, the gate contact landing pad 5C or 5D is an extension part of the gate line 4. The gate contact element 6C or 6D is coupled to the gate contact landing pad 5C or 5D. In an embodiment, the gate contact element 6C is formed within the boundary of the top surface of the gate contact landing pad 5C. In another embodiment, the gate contact element 6D extends beyond the boundary of the top surface of the gate contact landing pad 5D.

Referring to FIGS. 1-3, in all of the embodiments of the application, the gate contact landing pad 5, the gate contact element 6 and the dummy fin 3 of the application share a common area of the FinFET device. In this way, the area of the FinFET device of the application may be used more efficiently, thus the FinFET device may consume less area. Although only a contact structure applied to the gate line 4 is illustrated in FIGS. 1-3, it can be understood by those skilled in the relevant art that the contact structure illustrated in FIG. 1-3 can also be applied to other conductive lines, for example, source lines, drain lines, and word lines (not shown in FIGS. 1-3).

Referring to FIGS. 1 and 2, in some embodiments, the substrate 1 may be formed of silicon. In other embodiments, the substrate 1 can be made of other semiconductor materials, such as germanium, and gallium arsenide. In an embodiment, the substrate 1 may include an insulating layer 11, such as a BOX (Buried Oxide) structure upon which fins 2 are formed to isolate them from the substrate 1. In further embodiments, the substrate 1 may include an SOI (Silicon On Insulator) structure. Further insulating layers may be used in further embodiments, such as nitride, silicon nitride, or nitride with a double layer of oxide for example.

In some embodiments, the fin 2 has a cross-section taken along its length which is substantially in the shape of a rectangle. In other embodiments, the cross-section of the fin 2 along its length is substantially in the shape of a rectangle with rounded corners. In an embodiment, the height to width ratio of the fin 2 is in the range of about 3:1 to 5:1. In an embodiment, the width of the fin 2 is approximately 20 nm. The height and width may be significantly varied, as may be the ratio to obtain transistors with different desired characteristics. A larger height may provide a transistor capable of driving more current without requiring additional chip real estate.

In some embodiments, the fin 2 is made of n-doped or p-doped silicon. In other embodiments, the fin 2 may also be made of other semiconductor materials, one or more of which is selected from a group of semiconductor materials consisting of germanium, silicon carbide, gallium arsenate, and indium phosphate.

In some embodiments, the fin 2 is coated with an insulating film 7 made of silicate. Other insulating films may be used in further embodiments. In one embodiment, the dummy fin 3 may also be coated with an insulating film 8 made of silicate. The thickness of the insulating layer 7 or 8 may be, for example, about 1 nm. In some embodiments, dummy fin 3 may have the same shape or structure as the fin 2 has. Alternatively, dummy fin 3 may have a different shape or structure than fin 2.

In some embodiments, the gate line 4 is made of poly silicon. In other embodiments, the gate line 4 is made of one or more metals selected from the group of metals consisting of tungsten, copper, silver, gold, and aluminum. Other suitable metals or conductive materials may also be used to make the gate line 4.

In some embodiments, the source regions 9 of the fin 2 are coupled to a source line (not shown in Figures), and the drain regions 10 of the fin 2 are coupled to a drain line (not shown in Figures). The source line may be made of one or more metals selected from the group of metals consisting of tungsten, copper, silver, gold, and aluminum. Other suitable metals or conductive materials may also be used to make the source line. The drain line may be made of one or more metals selected from the group of metals consisting of tungsten, copper, silver, gold, and aluminum. Other suitable metals or conductive materials may also be used to make the drain line.

In some embodiments, the gate contact landing pad 5 is made of one or more metals selected from the group of metals consisting of tungsten, copper, silver, gold, and aluminum. In other embodiments, the gate contact landing pad 5 and the gate line is made of the same material. As mentioned previously, in some embodiments, the gate contact landing pad 5 and gate line 4 are formed in one body, e.g., the gate contact landing pad 5 may be an enlarged part or an extension part of the gate line 4.

Figure 4:
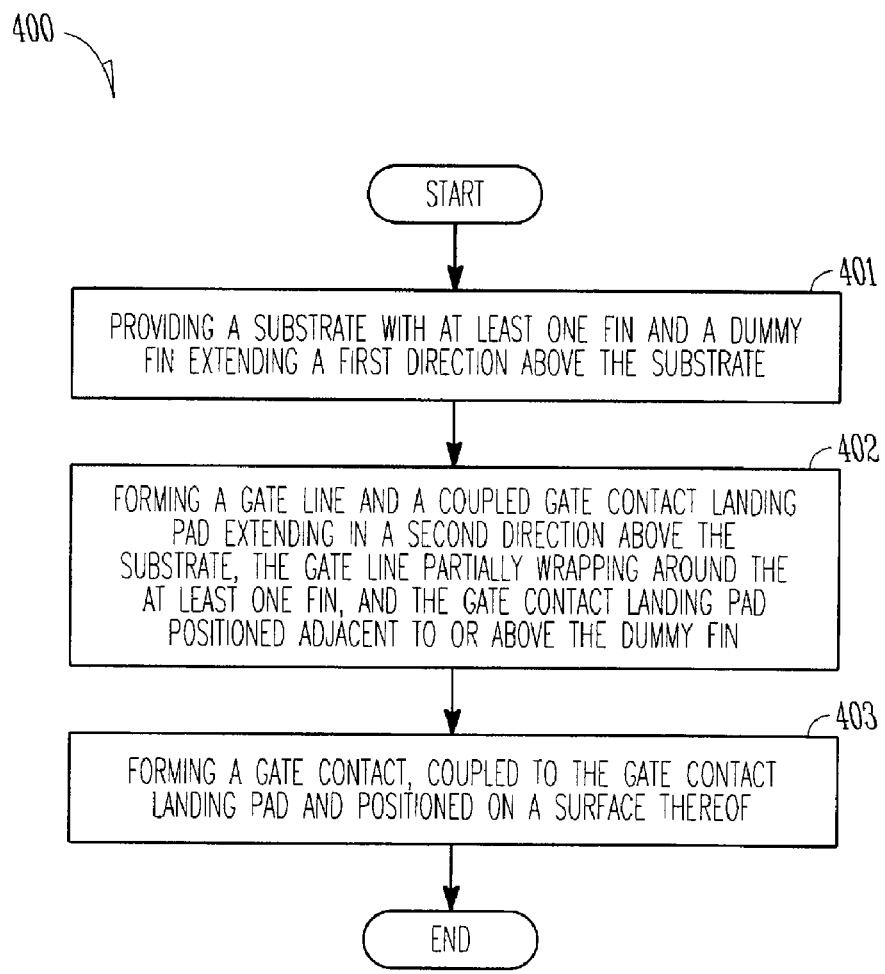
FIG. 4 is a flowchart illustrating a method of manufacturing a FinFET device with a dummy fin in accordance with an example embodiment.

FIG. 4 is a flowchart illustrating a method 400 of manufacturing the FinFET device 100 with a dummy fin 3 in accordance with an embodiment of the application. In the embodiment, a gate contact element 6 is formed adjacent to or above an existing dummy fin 3.

In one embodiment, traditional semiconductor processing steps, such as deposition, removal, patterning, and modifying electrical properties, can be used in manufacturing a FinFET device, and various technologies can be used in the processing steps. For example, in a deposition process, physical vapor deposition (PVD), chemical vapor deposition (CVD), electrochemical deposition (ECD), molecular beam epitaxy (MBE) or atomic layer deposition (ALD) can be used to form a layer of a material onto another material. In a removal process, wet etching, dry etching, and chemical-mechanical planarization (CMP) can be used to remove material either in bulk or in selective form. In a patterning process, lithography can be used to shape a material or alter an existing shape of a material. In a process of modifying electrical properties, doping (e.g., by diffusion and ion implantation), furnace anneal, and rapid thermal anneal (RTA) can be used to modify electrical properties of a material.

At 401, a substrate 1 may be provided having one or more fins 2 and a dummy fin 3 extending a first direction (Y direction shown in FIG. 1) above the substrate 1. The substrate 1 may be made of silicon. The substrate 1 may also be made of other semiconductor materials, such as germanium, and gallium arsenide. Optionally, the substrate 1 may include an insulating layer 11, such as a BOX (Buried Oxide) structure, on the top surface of substrate 1.

At 402, a gate line 4 and a coupled gate contact landing pad 5 are formed. The gate line 4 may extend in a second direction (X direction shown in FIG. 1) above the substrate 1 and partially wrapping around the fins 2, and the gate contact landing pad 5 positioned adjacent to or above the dummy fin 3.

At 403, gate contact element 6 may be formed on the top surface of the gate contact landing pad 5, and electrically coupled thereto. In some embodiments, the gate contact element 6 is an opening filled with conductive material.

Figure 5:
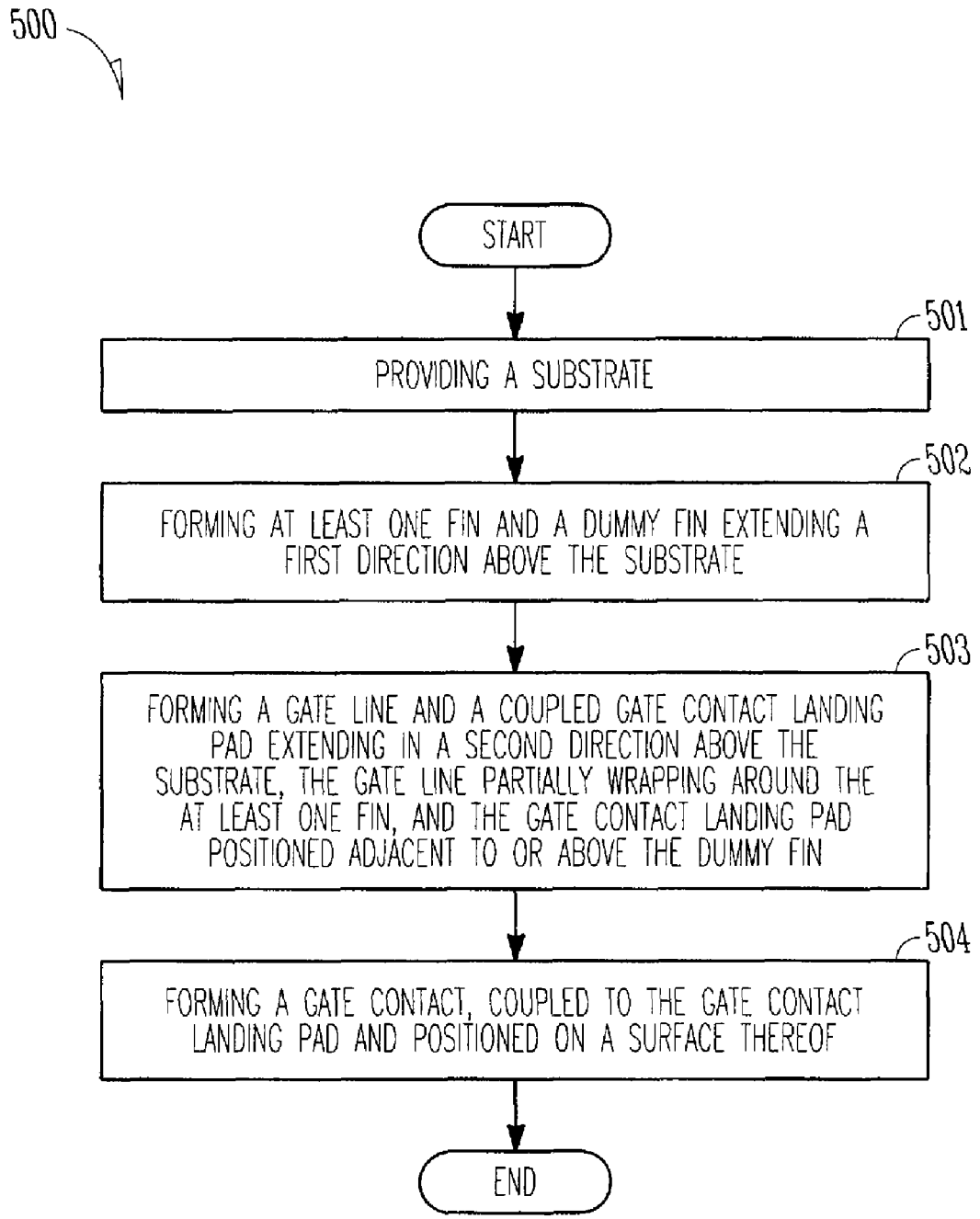
FIG. 5 is a flowchart illustrating a method of manufacturing a FinFET device with a dummy fin in accordance with another example embodiment.

FIG. 5 is a flowchart illustrating a method 500 of manufacturing the FinFET device 100 with a dummy fin 3 in accordance with another embodiment of the application. In one embodiment, a dummy fin 3 is added in the same processing step with fins 2, and a gate contact element 6 is formed adjacent to or above the added dummy fin 3.

At 501, a substrate 1 is provided. The substrate 1 may be made of silicon. The substrate may also be made of other semiconductor materials, such as germanium, and gallium arsenide. Optionally, the substrate 1 may include an insulating layer 11, such as a BOX (Buried Oxide) structure.

At 502, one or more fins 2 and a dummy fin 3 are formed, extending a first direction (Y direction shown in FIG. 1) above the substrate 1.

At 503, gate line 4 and a coupled gate contact landing pad 5 are formed. The gate line 4 extends in a second direction (X direction shown in FIG. 1) above the substrate 1 and partially wrapping around the fin 2, and the gate contact landing pad 5 positioned adjacent to or above the dummy fin 3.

At 504, a gate contact element 6 is formed on the top surface of the gate contact landing pad 5, and electrically coupled thereto. In some embodiments, the gate contact element 6 is an opening 16 filled with conductive material.

With the arrangement and structure in accordance with the various embodiments described, the devices using FinFETs having gate contact elements on top of or nearby dummy fins may have enhanced gate density, less area consumption, and a uniform neighborhood for enhanced printability than conventional devices. Additionally, without need for removing dummy fins in the process of manufacturing semiconductor devices, the cost for manufacturing the semiconductor devices using FinFETs in accordance with the embodiments of the application may also be reduced.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

The invention claimed is:

1. A FinFET device, comprising:
   at least one fin, extending in a first direction and supported by a substrate;
   a dummy fin, extending in the first direction and supported by the substrate;
   a gate line, extending in a second direction and supported by the substrate and partially wrapping around the fin;
   a gate contact landing pad electrically coupled to the gate line, supported by the substrate and partially wrapping around the dummy fin; and
   a gate contact element electrically coupled to the gate contact landing pad, supported by a top surface thereof.

2. The FinFET device of claim 1, wherein the gate contact landing pad wraps around a top surface and at least one side surface of the dummy fin.

3. The FinFET device of claim 1, wherein the gate contact landing pad is made of one or more metals selected from the group of metals consisting of tungsten, copper, silver, gold, aluminum, and their alloys.

4. The FinFET device of claim 1, wherein the gate contact element is an opening filled with conductive material, the conductive material is made of one or more metals selected from the group of metals consisting of tungsten, copper, silver, gold, aluminum, and their alloys.

5. The FinFET device of claim 1, wherein the fin and the dummy fin are made of one or more doped semiconductor materials selected from a group of semiconductor materials consisting of silicon, germanium, silicon carbide, gallium arsenate, and indium phosphate.

6. A FinFET device, comprising:
   at least one fin, extending in a first direction and supported by a substrate;
   a dummy fin, extending in the first direction and supported by the substrate;
   a conductive line, extending in a second direction and supported by the substrate and partially wrapping around the fin;

a conductive line contact landing pad electrically coupled to the conductive line, supported by the substrate and partially wrapping around the dummy fin; and a conductive line contact element, supported by a top surface of the conductive line contact landing pad, and electrically coupled to the conductive line contact landing pad.

7. The FinFET device of claim 6, wherein the conductive line is made of one or more metals selected from the group of metals consisting of tungsten, copper, silver, gold, aluminum, and their alloys.

8. The FinFET device of claim 6, wherein the space between the substrate, the at least one fin, the dummy fin, the conductive line, and the conductive line contact landing pad is filled with borophosphosilicate glass (BPSG).

9. The FinFET device of claim 6, wherein each of the at least one fin and the dummy fin are substantially in the shape of a rectangle.

10. The FinFET device of claim 6, wherein the height to width ratio of each of the at least one fin and the dummy fin is substantially 3:1 to 5:1.

* * * * *